United States Patent
Azuma (10) Patent No.: US 9,147,711 B1
(45) Date of Patent: Sep. 29, 2015

(54) CAMERA MODULE INCLUDING FLIP CHIP IMAGE SENSOR

(71) Applicant: Amazon Technologies, Inc., Reno, NV (US)

(72) Inventor: Eddie Alex Azuma, Pleasanton, CA (US)

(73) Assignee: Amazon Technologies, Inc., Reno, NV (US)

( * ) Notice: Subject to any disclaimer, the term of this patent is extended or adjusted under 35 U.S.C. 154(b) by 0 days.

(21) Appl. No.: 14/305,365

(22) Filed: Jun. 16, 2014

(51) Int. Cl.
*H01L 27/146* (2006.01)
*H01L 27/148* (2006.01)

(52) U.S. Cl.
CPC ........ *H01L 27/14643* (2013.01); *H01L 27/148* (2013.01); *H01L 27/14627* (2013.01)

(58) Field of Classification Search
USPC .......................................................... 257/432
See application file for complete search history.

(56) References Cited

U.S. PATENT DOCUMENTS

| | | | |
|---|---|---|---|
| 7,423,306 B2 * | 9/2008 | Liu et al. ........................ | 257/292 |
| 8,030,653 B2 * | 10/2011 | Kim ................................ | 257/59 |
| 8,253,178 B1 * | 8/2012 | Yang et al. .................... | 257/291 |
| 8,497,536 B2 * | 7/2013 | Chen et al. .................... | 257/293 |
| 2012/0062762 A1 * | 3/2012 | Rhodes ........................ | 348/222.1 |
| 2014/0034950 A1 * | 2/2014 | Li ................................... | 257/53 |

OTHER PUBLICATIONS

Chang, et al., "Process Integration of Backside Illuminated Image Sensor with Thin Wafer Handling Technology," IEEE 63rd Electronic Components and Technology Conference (ECTC), pp. 1880-1886, (2013).

Matthias, et al., "CMOS Image Sensor Wafer-level Packaging," 12th International Conference on Electronic Packaging Technology and High Density Packaging, pp. 1-6, (Aug. 2011).

* cited by examiner

*Primary Examiner* — Thao P Le
(74) *Attorney, Agent, or Firm* — K&L Gates LLP (57) ABSTRACT

Various embodiments are directed to a camera module, image sensor die, and methods for manufacturing the same. The image sensor die comprises a thinned wafer portion, a photosensor portion adjacent the thinned wafer portion and a carrier wafer. Vias may be formed through the carrier wafer to connect the photosensor portion to die contacts. A first side of the image sensor die opposite the die contacts may be bonded to a first side of the rigid substrate. Wire bonds may be formed between the die contacts and substrate-sensor contacts positioned on the first side of the rigid substrate.

20 Claims, 11 Drawing Sheets

CAMERA MODULE INCLUDING FLIP CHIP IMAGE SENSOR

BACKGROUND

Digital camera functionality is being incorporated into a wide variety of electronic devices. In particular, there is an increased demand by consumers for high quality photographic capability in consumer electronics and mobile computing devices, such as mobile phones, smartphones, and tablet computers. In addition, there is an ongoing desire to improve quality and functionality while decreasing the cost of components and manufacturing.

Accordingly, there is a need for improved camera module designs and manufacturing processes for incorporation into electronic devices.

DETAILED DESCRIPTION

In the following description, reference is made to the accompanying drawings which illustrate several embodiments of the present invention. It is understood that other embodiments may be utilized and mechanical, compositional, structural, electrical operational changes may be made without departing from the spirit and scope of the present disclosure. The following detailed description is not to be taken in a limiting sense, and the scope of the embodiments of the present invention is defined only by the claims of the issued patent.

Systems and methods in accordance with various embodiments of the present disclosure provide improved manufacturing methods and camera module designs that are inexpensive to manufacture and have low manufacturing yield loss. These designs may provide small form factor autofocus (AF) camera modules for incorporation into thin mobile devices, such as tablets or smartphones.

Figure 1:
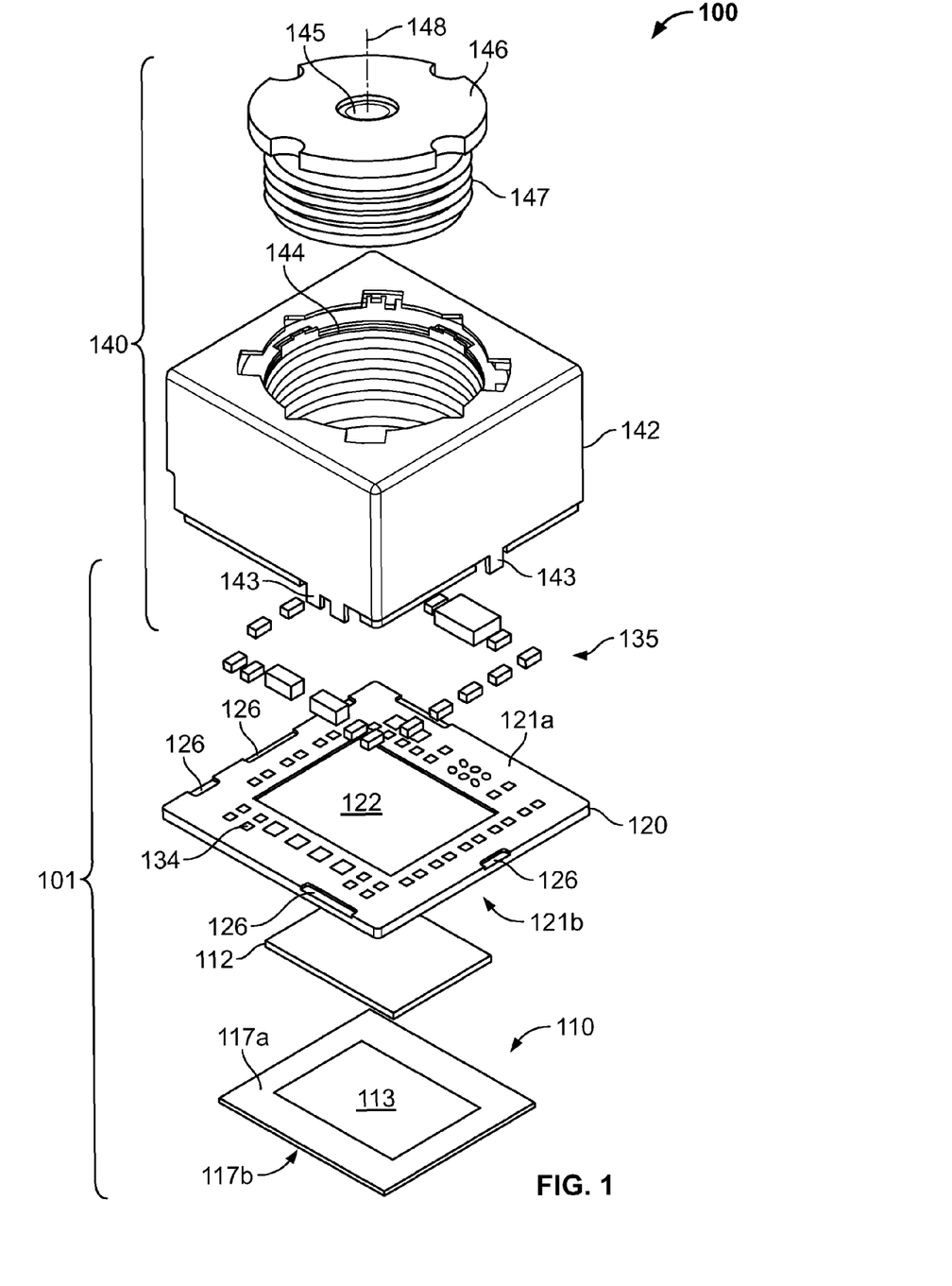
FIG. 1 is an exploded perspective view of one embodiment of a camera module with a flip-chip image sensor die positioned for a wire bond connection to a substrate, in accordance with embodiments of the present invention.
Figure 4A:
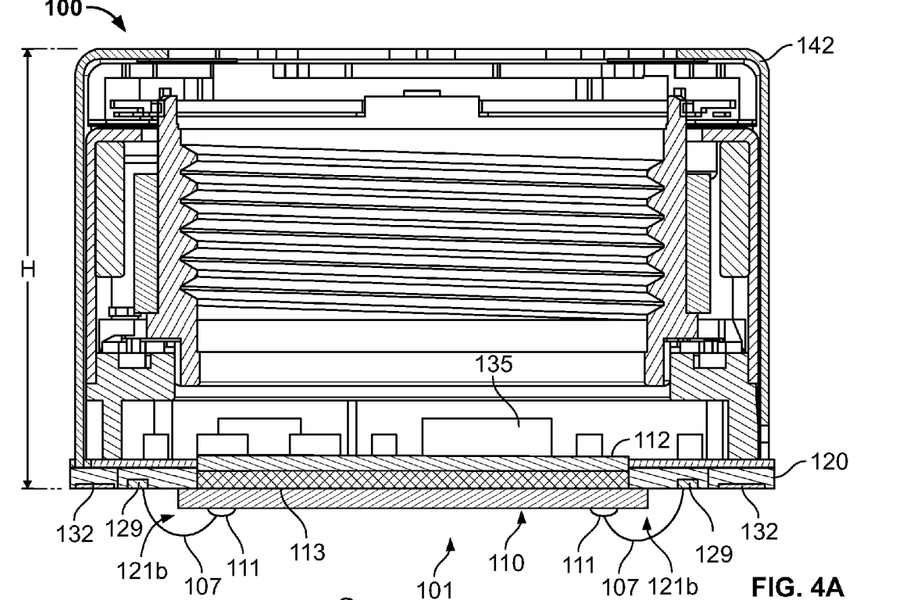
FIGS. 4A-4B are cross-sectional and perspective cross-sectional views of a camera module, in accordance with embodiments of the present invention.
Figure 4B:
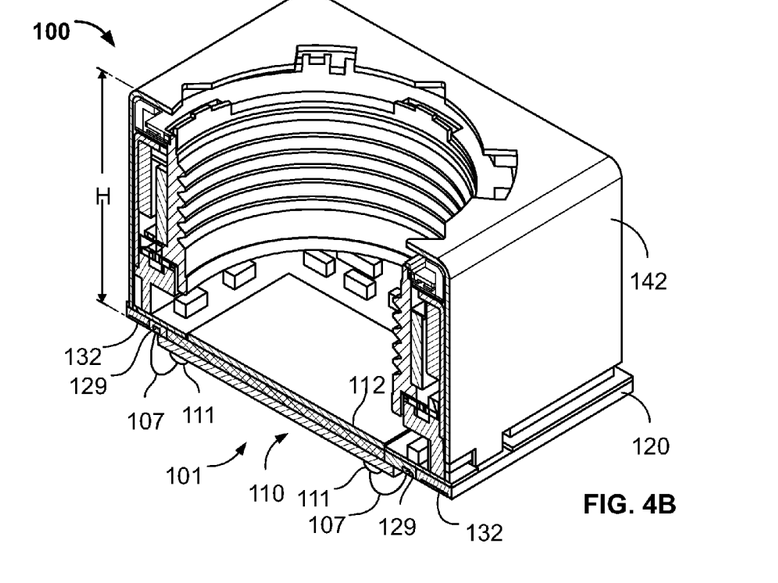

FIG. 1 is an exploded perspective view of a camera module 100 with a flip-chip image sensor die positioned for a wire bond connection to a substrate, in accordance with embodiments of the present invention. FIGS. 4A-4B are cross-sectional and perspective cross-sectional views of the camera module 100, in accordance with embodiments of the present invention.

The camera module 100 comprises an image sensor module 101 and a lens module 140. The image sensor module 101 comprises an image sensor 110, an infrared (IR) filter 112, a substrate 120, and electronic components 135.

The lens module 140 comprises an autofocus lens housing 142 forming a cavity containing one or more lenses 145 which are supported by a lens barrel 146. The lens barrel 146 includes a threaded section 147 and is received in a corresponding lens barrel 144, which is driven by motors or actuators in the lens housing 120 to rotate, thereby translating the lens barrel 146 up and down along optical axis 148. The lens module 140 may utilize voice coil motors (VCM) to move the lens barrel 146 along the optical axis 148 of the camera. Alternatively, microelectromechanical systems (MEMS) actuators, may be used to translate the lenses 145. A variety of camera modules, including a variety of multi-lens autofocus camera modules, are commercially available and may be utilized in accordance with various embodiments of the present invention.

The substrate 120 may comprise any form of circuit substrate suitable to provide the necessary interconnection structure for operation of the camera module 100, as is well known in the art. The substrate 120 may comprise, for example, a rigid substrate or a rigid flex substrate and may have one or more interconnect and dielectric layers. A rigid substrate may be a substrate that is relatively inflexible such as a laminate (e.g., a glass-reinforced epoxy-based laminate comprising FR-4, FR-5, and/or Bismaleimide-Triazine (BT) resin), ceramic. A rigid flex substrate may be a substrate comprising rigid and flexible layers laminated to one another. The substrate 120 includes an image sensor opening 122, which exposes the image sensor die 110 to the light received by the lenses 145.

The die 110 may be mechanically coupled to the lower side 121b of the substrate 120 such that a photosensor portion 113 of the die 110 is exposed through the image sensor opening 122. The die 110 may be mechanically coupled to the lower side 121b of the substrate 120 in any suitable manner. In some examples, the die 110 is mechanically coupled to the lower side 121b of the substrate 120 using a technique and/or material that creates a rigid connection that is not prone to excessive shifting or other movement based on environmental conditions. In some example, the die 110 may be secured using a non-conductive epoxy polymer or non-conductive paste. In some examples, conductive coupling techniques are used. A solder paste may be applied to the die 110 and/or the lower side 121b of the substrate 120 and processed according to standard re-flow soldering techniques. In some examples, an anisotropic conductive film may be used. Conductive couplings between the die 110 and the lower side 121b of the substrate 120 may be utilized, for example, as described herein to provide an optional ground or other connection between the die 110 and the substrate. The lower side 121b may comprise a plurality of substrate-sensor contacts 129 (Shown in FIGS. 4A and 4B). The image sensor die 110 includes a plurality of die contacts 111 formed along a periphery of the image sensor die 110 which are coupled to the substrate-sensor contacts 129 via wire-bond connections 107, as will be described in greater detail below.

In the illustrated embodiment, the upper side 121*a* of the substrate 120 includes a plurality of component contacts 134 for coupling with the electronic components 135. The electronic components 135 may include passive and/or active components for processing the output signals from the image sensor. The passive components may include inductors, capacitors, or resistors. The electronic components 135 are coupled to the component contacts 134 formed on the substrate, thereby electrically coupling the passive components 135 with the image sensor die 110 via the substrate-sensor contacts 129.

The image sensor die 110 includes the photosensor portion 113 comprising any type of image capturing element that converts an optical image into an electronic signal, such as a charge-coupled device (CCD) or complementary metal-oxide-semiconductor (CMOS) active pixel sensor. In some embodiments, the photosensor portion 113 may comprise a flip-chip CMOS or other suitable sensor, as described in greater detail below. An IR filter 112 may be used for filtering infrared light received by the lens module 140. The photosensor portion 113 may be sensitive to any suitable wavelength of electromagnetic energy including, for example, visible spectrum energy, infrared (IR) energy, ultraviolet energy, etc. For example, the IR filter 112 may be omitted and/or replaced with a filter or filters of a different bandwidth depending on the desired sensitivity of the image sensor die 110.

Figure 2A:
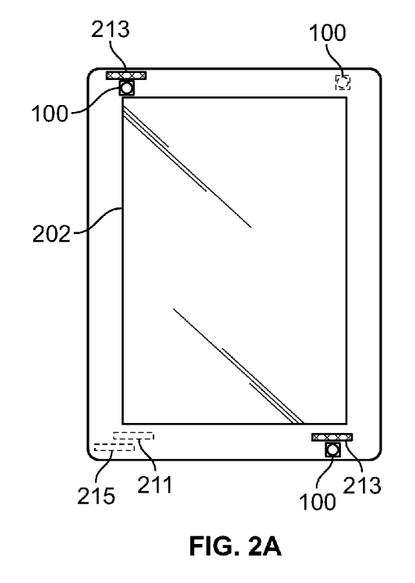
FIGS. 2A-2B illustrate front and back views, respectively, of an example portable computing device that may incorporate a camera module in accordance with embodiments of the present invention.
Figure 2B:
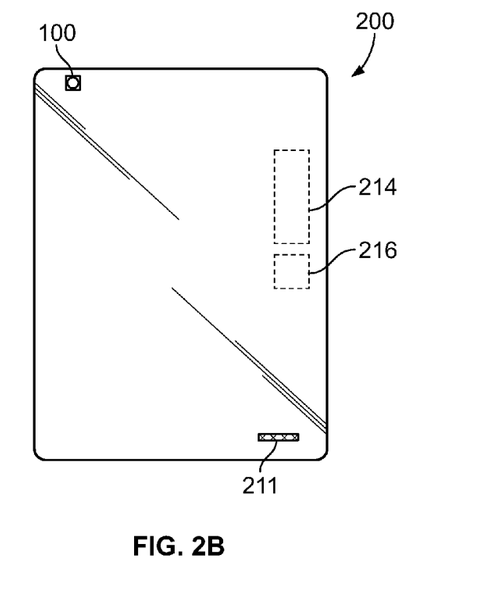

The camera module 100 may be incorporated into any of a variety of electronic devices. FIGS. 2A-2B illustrate front and back views, respectively, of an example portable computing device 200 that may incorporate a camera module in accordance with various embodiments described herein. Although one example of an electronic device is shown, it should be understood that various other types of electronic devices that are capable of incorporating digital camera functionality can be used in accordance with various embodiments discussed herein. The electronic devices can include, for example, smartphones, electronic book readers, tablet computers, notebook computers, personal data assistants, cellular phones, video gaming consoles or controllers, television set top boxes, and portable media players, among others.

In this example, the portable computing device 200 has a display 202 (e.g., a liquid crystal display (LCD) element) operable to display image content to one or more users or viewers of the device. In at least some embodiments, the display screen provides for touch or swipe-based input using, for example, capacitive or resistive touch technology.

Figure 3:
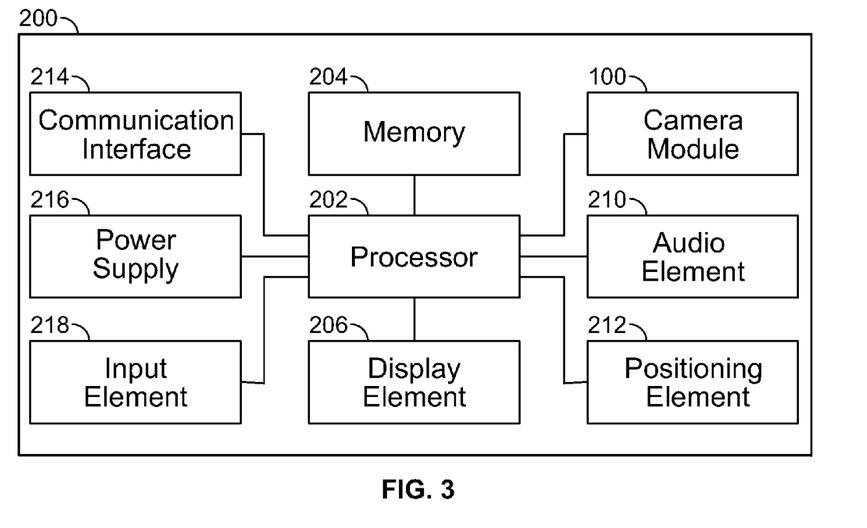
FIG. 3 is an example block diagram illustrating basic components of a computing device, in accordance with embodiments of the present invention.

FIG. 3 is an example block diagram illustrating basic components of a computing device, such as computing device 200. In this example, the device 200 includes at least one processor 202 for executing instructions that can be stored in at least one memory device 204. As would be apparent to one of ordinary skill in the art, the memory device 204 can include one or more different types of memory, data storage or computer-readable storage media, such as, for example, a first data storage for program instructions for execution by the processor 202, a second data storage for images or data and/or a removable storage for transferring data to other devices.

The computing device 200 includes one or more camera modules 100 configured to capture an image of people or objects in the vicinity of the device 200. The computing device 200 may include a main board, which may be the primary circuit board for the computing device 200 onto which one or more of the following components may be mounted. The camera module 100 includes a circuit substrate 120 which may be electrically coupled to the main board of the computing device 200 in a variety of ways, such as by direct mounting to the main board or with an interposer, which serves as an intermediate coupling device providing an electrical interface between the circuit substrate 120 and the main board. The interposer may comprise, for example, a cable or a rigid or flexible circuit board having interfaces coupled to the circuit substrate 120 and the main board, as will be described in greater detail below.

The computing device 200 includes a display element 206 for displaying images using technologies such as, for example, electronic ink (e-ink), organic light emitting diode (OLED) or liquid crystal display (LCD). The computing device 200 may also include an audio element 210, such as one or more audio speakers 211 and/or audio capture elements capable of capturing audio data, such as microphones 213. The computing device 100 may also include a positioning element 212, such as motion, position or orientation determining element 215 that provides information, such as a position, direction, motion, or orientation of the device 200. The computing device 200 can include one or more input elements 218 operable to receive inputs from a user. The input elements 218 can include, for example, a push button, touch pad, touch screen, wheel, joystick, keyboard, mouse, trackball, keypad or any other such device or element whereby a user can provide inputs to the computing device 200. The computing device 200 may also include at least one communication interface 214, comprising one or more wireless components operable to communicate with one or more separate devices within a communication range of the particular wireless protocol. The wireless protocol can be any appropriate protocol used to enable devices to communicate wirelessly, such as Bluetooth, cellular, or IEEE 802.11. It should be understood that the computing device 200 may also include one or more wired communications interfaces for coupling and communicating with other devices. The computing device 200 may also include a power supply 216, such as, for example, a rechargeable battery operable to be recharged through conventional plug-in approaches, or through other approaches such as capacitive charging.

Figure 5:
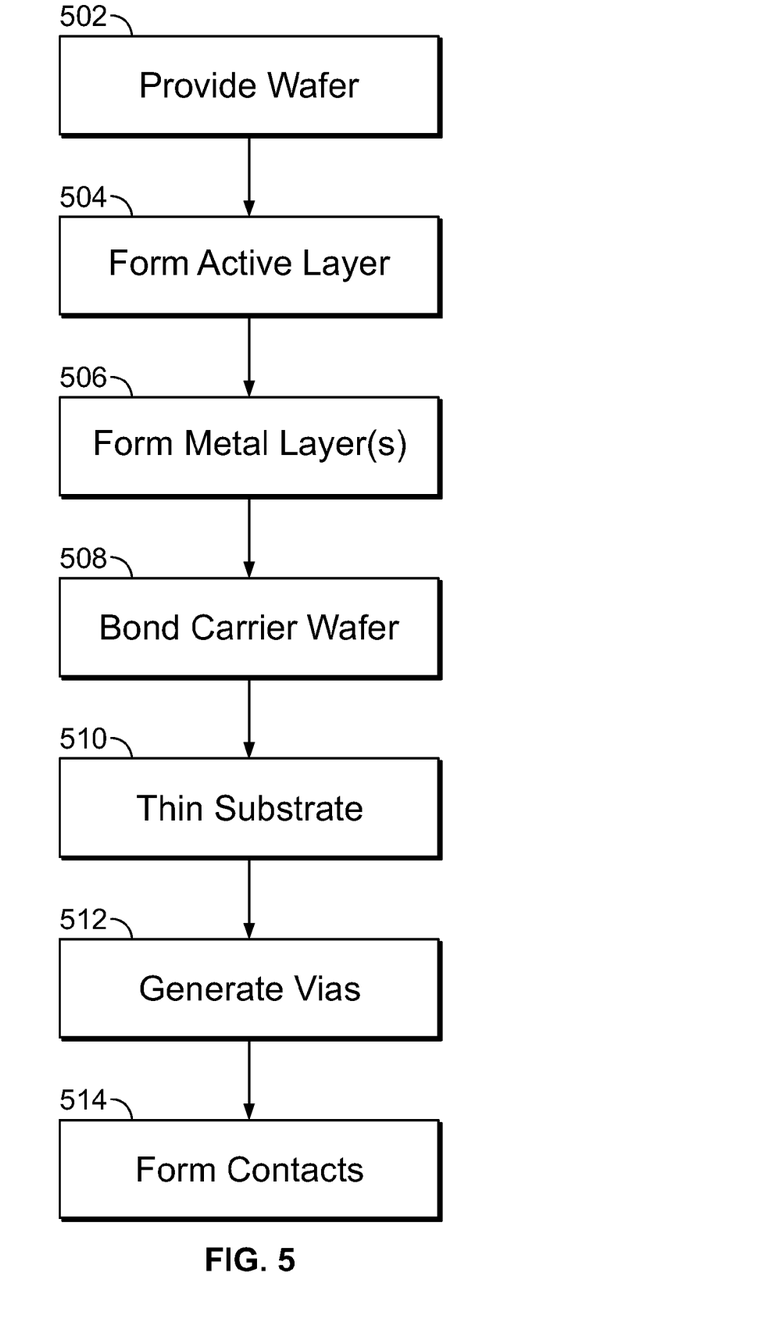
FIG. 5 is a flowchart illustrating a process flow for manufacturing the sensor of FIGS. 1, 4A and 4B, in accordance with embodiments of the present invention.

FIG. 5 is a flowchart illustrating a process flow 500 for manufacturing the sensor 110, in accordance with embodiments of the present invention. FIGS. 6A-6G are diagrams showing intermediate processing stages for forming the sensor, in accordance with various embodiments of the present invention. At 502 (FIG. 5) a semiconductor wafer 600 (shown in cross-section in FIG. 6A) may be provided. The semiconductor wafer 600 may be formed from any suitable semiconductor with any suitable doping. For example, in some embodiments, the wafer 600 may comprise all or part of a silicon wafer.

Figure 6A:
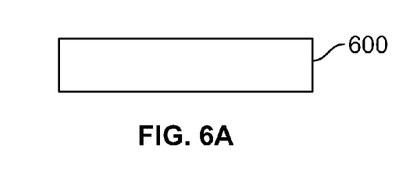
FIGS. 6A-6G are diagrams showing intermediate processing stages for forming the sensor of FIGS. 1, 4A and 4B, in accordance with embodiments of the present invention.
Figure 6B:
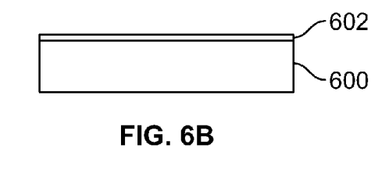

At 504, an active layer 602 may be formed on the wafer 600, as illustrated in FIG. 6B. The active layer 602 may be formed, for example, by doping various portions of the wafer 600 to form a CMOS photodiode, charge coupled device, or other photosensitive device. For example, a grid of distinct photosensitive devices may be formed with each element or group of elements on the grid corresponding to one pixel of the camera module.

Figure 6C:
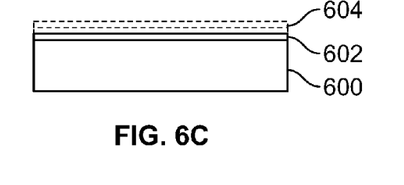

At 506, one or more metal layers 604 may be deposited on the active layer 602, as illustrated in FIG. 6C. The metal layers 604, for example, may provide electrical connections among the component or components of the active layer 602. It will be appreciated that some embodiments may include layers in addition to or instead of the layers described herein.

Figures 6D, 6F:
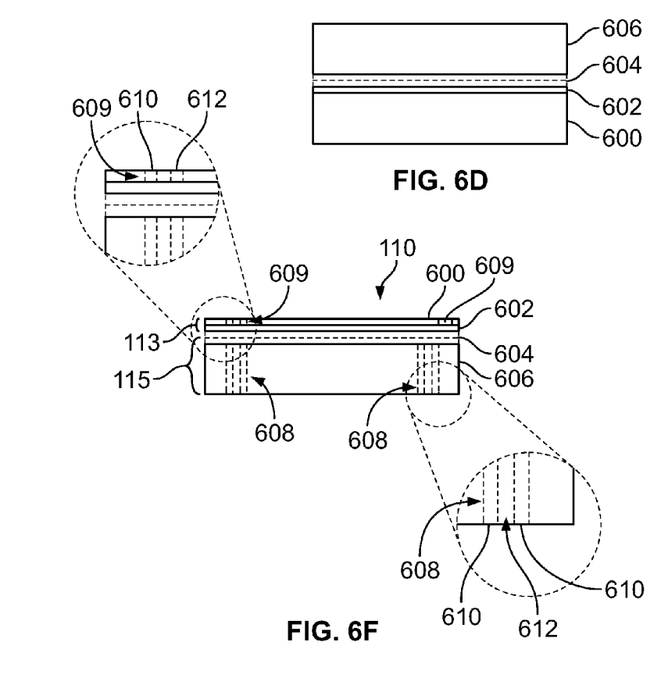

At 508, a carrier wafer 606 may be bonded to the wafer 600, as shown in FIG. 6D. The carrier wafer 606 may be made from any suitable material and, in some embodiments, may be made from silicon or another semiconductor. The carrier wafer 606 may be bonded to the wafer 600 using any suitable technique. For example, in some embodiments, the carrier wafer 606 may be bonded to the wafer 600 utilizing polymer adhesive bonding, low-temperature plasma-activated silicon oxide bonding, or any other suitable technique.

Figure 6E:
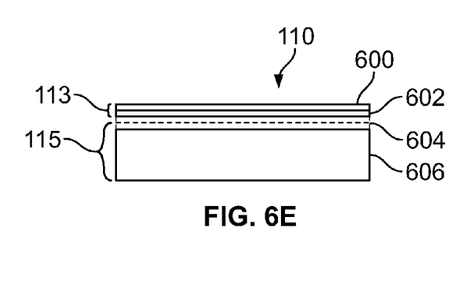

At 510, wafer 600 may be thinned to allow light to reach the active layer 602 through the wafer 600, as shown in FIG. 6E. For example, the assembly may be rotated 180 degrees or flipped, as illustrated in FIGS. 6D and 6E. Substrate thinning may be performed according to any suitable technique including, mechanical grinding, etching, etc. After thinning, the wafer 600 may have a thickness that allows light incident on the wafer 600 to be transmitted through the wafer material to the active layer 602. Suitable thicknesses, for example, may depend on the composition of the wafer and the wavelength or range of wavelengths of light to which the sensor 110 is to be sensitive. For example, when the wafer is made from silicon (Si), it may exhibit high transmittance in the visible spectrum (e.g., ~380 nanometers (nm) to ~750 nm) and in the infrared spectrum (e.g., ~750 nm to ~1,000 micrometers (μm)). Any suitable thickness may be used including, for example, 10-20 microns. It will be appreciated that various other components of the sensor 110 may be thinned in addition to the thinned wafer 600, for example, depending on the design and manufacturing techniques used.

At 512, vias may be formed as illustrated in FIG. 6F. For example, vias 608 may be formed in the carrier wafer 606. Optionally, one or more additional vias 609 may be formed in the thinned wafer 600. In some embodiments, vias 609 in the wafer 600 and/or vias 608 in the carrier wafer 606 may be formed before the wafer 600 is thinned at 510. The vias may be formed according to any suitable technique. For example, deep reactive ion etching (DRIE) or another suitable technique may be used to etch openings for the vias 608, 609. In some embodiments, a via insulator layer 610 is deposited on the walls of the vias 608, 609, for example, utilizing chemical vapor deposition (CVD). The insulating layer 610 may insulate signals transmitted by the vias 608, 609 from the surrounding carrier wafer 606. A via filler 612 may comprise a conductive material, such as a metal. The via filler 612 may take up all or a portion of the via 608, 609 and may be deposited according to any suitable technique. For example, the via filler 612 may formed by electrodeposition of copper, chemical vapor deposition (CVD) of tungsten, low-resistivity silicon, etc.

Figure 6G:
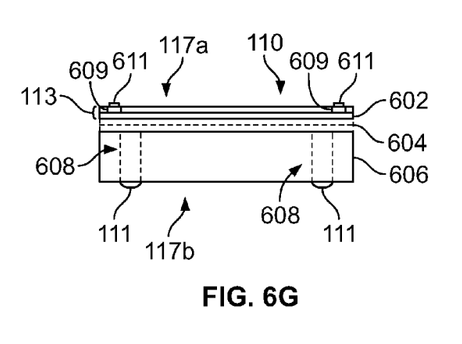

At 512, die contacts 111 may be formed at the vias 608 to facilitate wire-bonding of the sensor 110 to the substrate 120, as described herein below. The die contacts 111 may comprise any suitable material and form including, for example, gold stud bumps, sputter plated bumps, gold plated bumps or copper pillar bumps. When optional vias 609 are present, additional die contacts 611 may be formed.

The resulting sensor 110 may comprise the photosensor portion 113, comprising the active layer 602 and the thinned wafer 600, and the substrate portion 115 comprising the metal layer(s) 604 and the carrier wafer 606. The active portion 113 may be positioned on a first side 117a of the sensor die 110. The die contacts 111 may be positioned on a second side 117b of the sensor die 110.

Figure 6H:
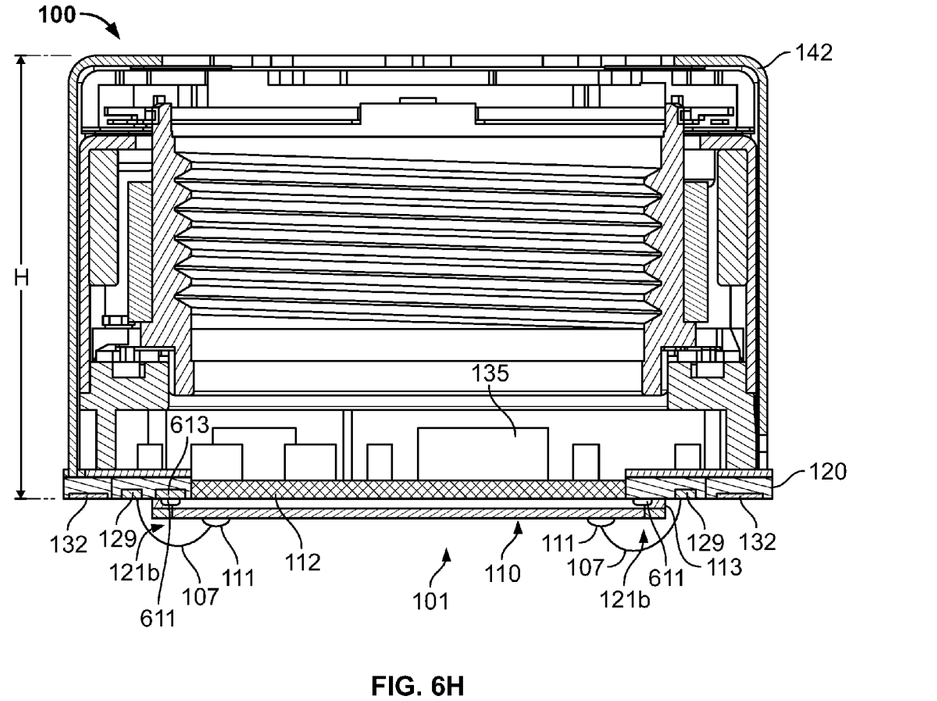
FIG. 6H is a cross-sectional view of a camera module, in accordance with embodiments of the present invention.

Optional vias 609 and die contacts 611 on the first side 117a of the sensor die 110 may be used for any suitable purpose. FIG. 6H is a cross-sectional view of a camera module 100, in accordance with embodiments of the present invention, comprising optional die contacts 611 on the first side 117a of the sensor die. In some embodiments, the substrate 120 comprises one or more corresponding contacts 613 that align with and are electrically coupled to one or more of the die contacts 611 when the die 110 is mechanically coupled to the substrate 120. In some embodiments, one or more of the die contacts 611 are positioned to be electrically coupled directly to the substrate 120 itself when the die 110 is mechanically coupled to the substrate 120. For example, the substrate 120 may not have a corresponding contact 613. Such connections may be used, for example, to ground the sensor die 110 to the substrate 120. Because it is not necessary for such connections to align with any particular contact on the substrate 120, alignment tolerances during manufacturing may be relaxed as compared to standard flip-chip implementations. In the example embodiment shown in FIG. 6H, the photosensor portion 113 is positioned below the substrate 120. For example, the mechanical coupling of the sensor die 110 to the substrate 120 occurs at the photosensor portion 113 and/or the thinned wafer 600. This configuration may be used in embodiments having vias 609 and contacts 611 through and on the thinned wafer 600 and may also be used in embodiments lacking vias 609 and contacts 611 through and on the thinned wafer 600, for example, as an alternative to the embodiment shown in FIGS. 1, 4A and 4B.

Figure 7:
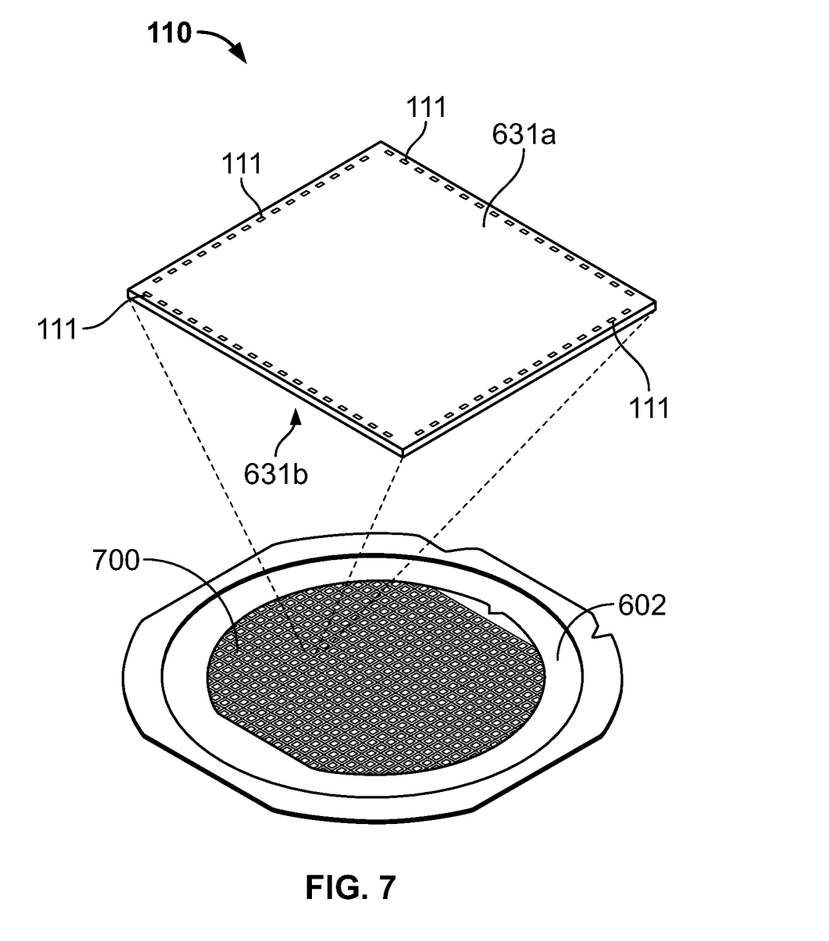
FIG. 7 shows a semiconductor wafer having a plurality of sensor dies formed thereon, in accordance with embodiments of the present invention.

It will be appreciated that the process flow 500 may be executed on a large scale to form many examples of the sensor die 110 simultaneously. For example, FIG. 7 shows a semiconductor wafer 700 having a plurality of sensor dies 110 formed thereon. The wafer 700 is illustrated in a wafer carrier 702. The sensor dies 110 may be formed, for example, as described herein above with respect to FIGS. 5 and 6A-6G. Also shown in FIG. 7 is a breakout of a single die 110 showing die contacts 111. Individual sensor dies 110 may be singulated or diced from the wafer 700 in any suitable manner.

Figure 8:
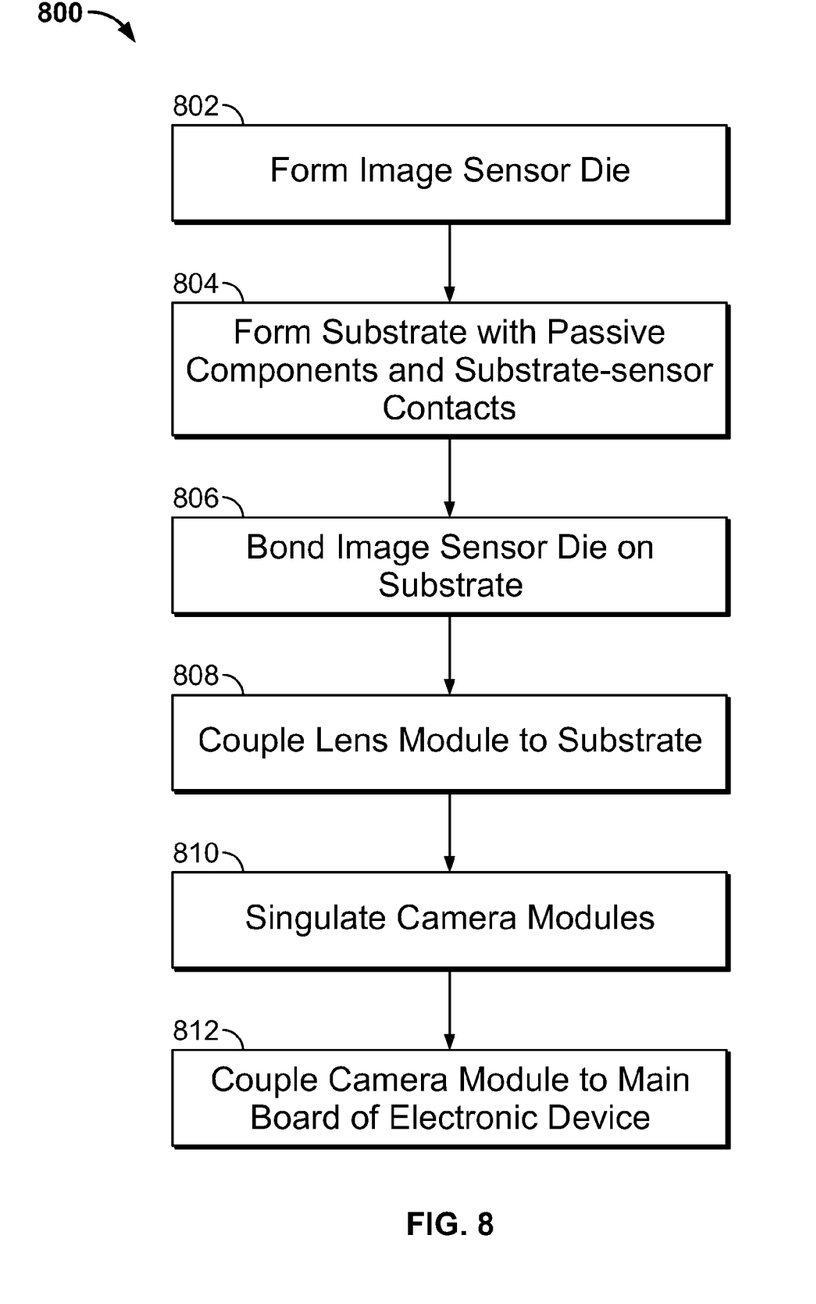
FIG. 8 is a flowchart illustrating a process flow for manufacturing a camera module including the sensor die, in accordance with embodiments of the present invention.

FIG. 8 is a flowchart illustrating a process flow 800 for manufacturing a camera module 100 including the sensor die 110, in accordance with embodiments of the present invention. FIGS. 9A-9F illustrate various steps in the manufacturing process 800.

In step 802, the image sensor die 110 is formed, for example, as described herein. As described, the second side 117b of the image sensor die 118 may comprise a plurality of die contacts 111. In step 804, shown in FIGS. 9A-9C, a plurality of substrates 120 are provided in a substrate strip array 920. The upper side 121a of each substrate 120 includes a plurality of component contacts 134 around the periphery of the image sensor opening 122. Electronic components 135 may be coupled to each of these contacts 134 using surface mount technology (SMT). A plurality of lens module connections 126 are provided along the outer edges of the substrate 120 for coupling with corresponding contacts 143 (shown in FIG. 1) in the lens housing 142. These lens module connections 126 may be used to provide power, ground, and control signals to the lens module 126. The various contacts provided on the substrate 120 may be formed, e.g., using electroless nickel immersion gold (ENIG) plating techniques. ENIG is an electroless nickel layer capped with a thin layer of immersion gold, which provides a multifunctional surface finish. The immersion gold protects the underlying nickel from oxidation/passivation.

Figure 9A:
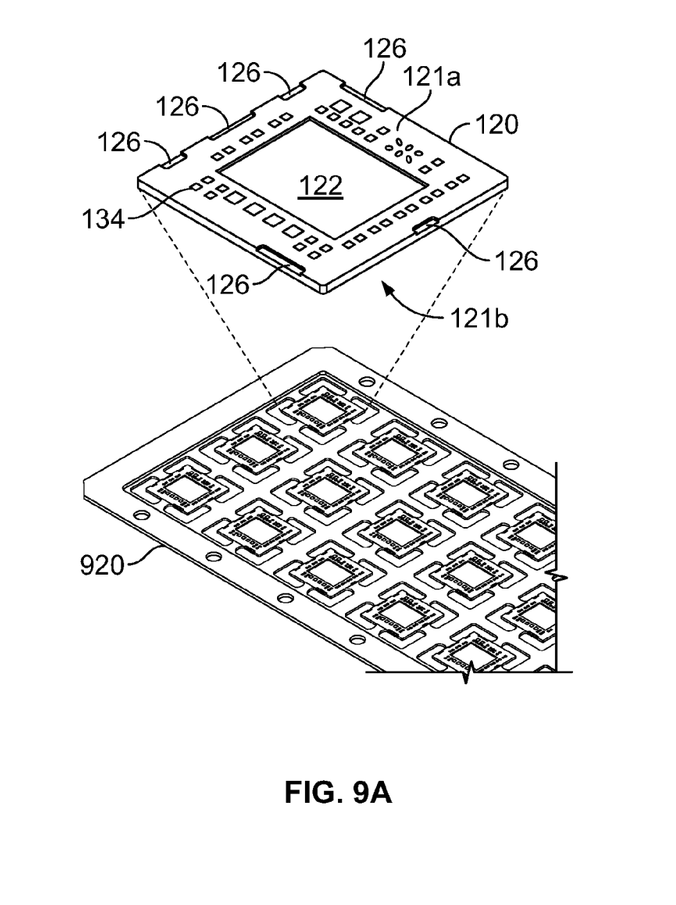
FIGS. 9A-9F illustrate various steps in the manufacturing process of FIG. 8.
Figure 9B:
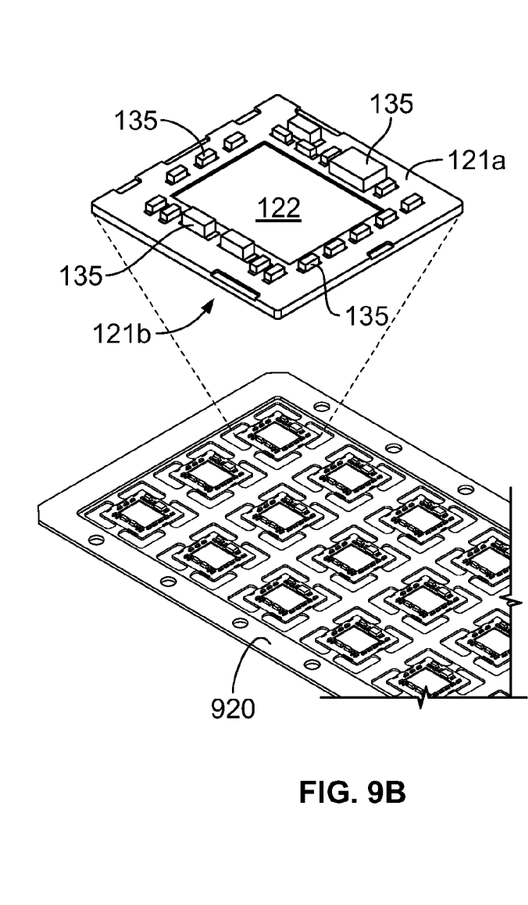
Figures 9C, 9D:
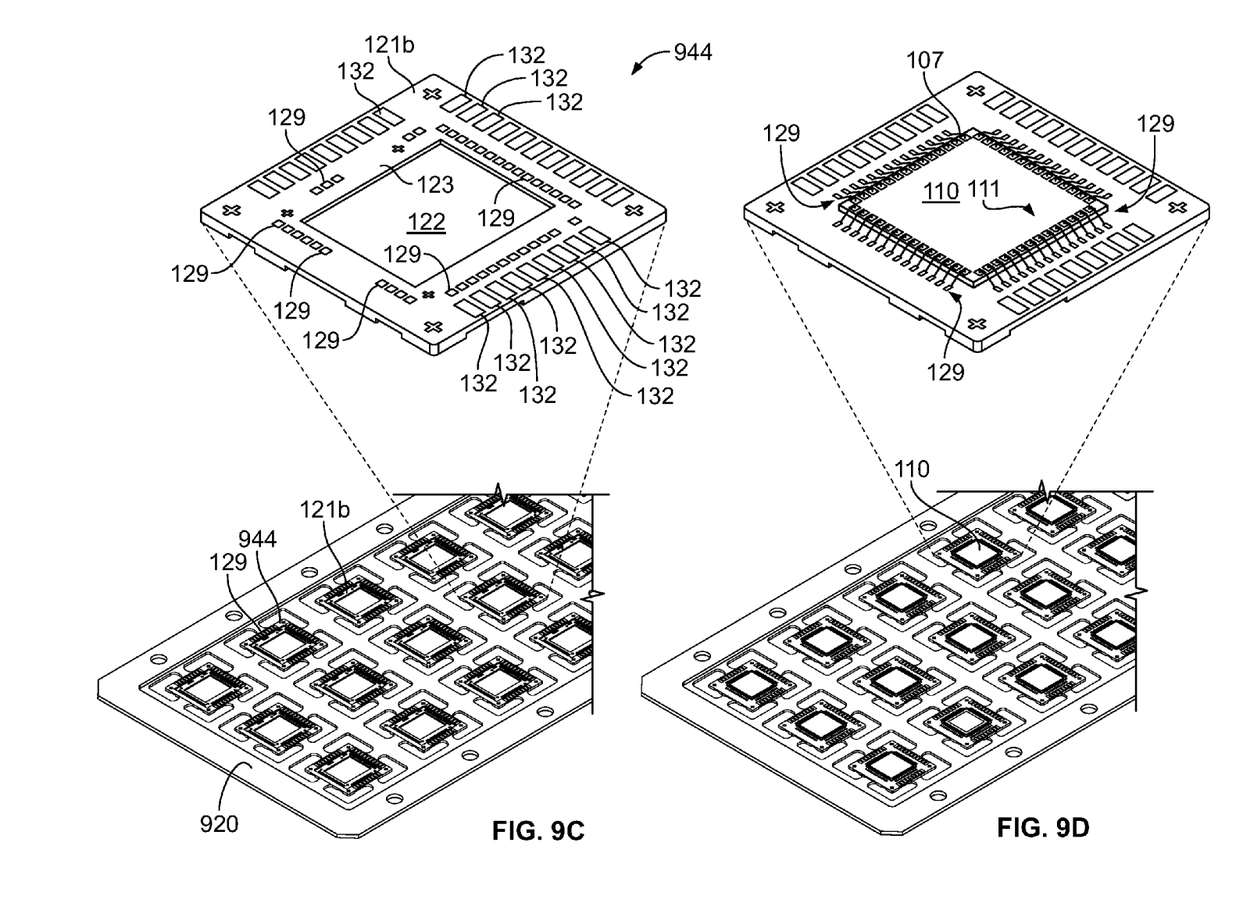

FIG. 9C shows the lower side 121b of each substrate 120. A plurality of substrate-sensor contacts 129 is formed on lower side 121b for bonding with the die contacts 111 on the image sensor die 110. The lower side 121b of the substrate 120 also includes a main board contact region comprising a land grid array 944 (LGA) of a plurality of main board contacts 132.

In step 806, shown in FIG. 9D, an image sensor die 110 is bonded to the substrate 120. For example, the image sensor die 110 may be mechanically and electrically bonded. Mechanical bonding may be accomplished, for example, utilizing a non-conductive epoxy polymer, a solder paste, or any other suitable method. In addition to mechanical bonding, the die contacts 111 of the sensor die 110 may be electrically coupled to the substrate-sensor contacts 129, for example, utilizing wire bonds 107, as described herein above with respect to FIGS. 4A and 4B. In embodiments where contacts 611 are present on the first side 117a of the substrate, the sensor die 110 may be mechanically coupled to the substrate 120 using a conductive coupling. For example, when contacts 611 correspond to substrate contacts 613, the contacts 611 may be aligned with and electrically coupled to the corresponding substrate contacts 613 using any suitable technology including, for example, anisotropic conductive film, hot-bar soldering, a ball grid array, etc. Contacts 611 that do not have corresponding substrate contacts 613 may be electrically coupled directly to the substrate 120. For example, the sensor die 110 may be mechanically coupled to the substrate 120 using a conductive coupling such as a solder paste, an anisotropic conductive film, etc. The conductive coupling may also create an electrical coupling between the contact 611 and the substrate 120. Also, for example, less precise alignment between the sensor die 110 and the substrate 120 may be necessary when there is no corresponding substrate contact 613.

Figure 9E:
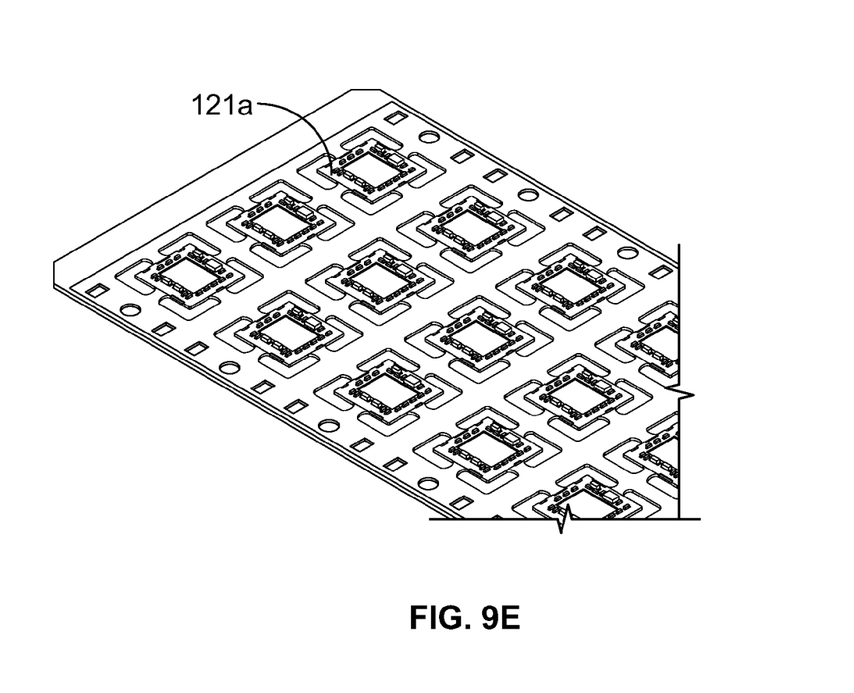
Figure 9F:
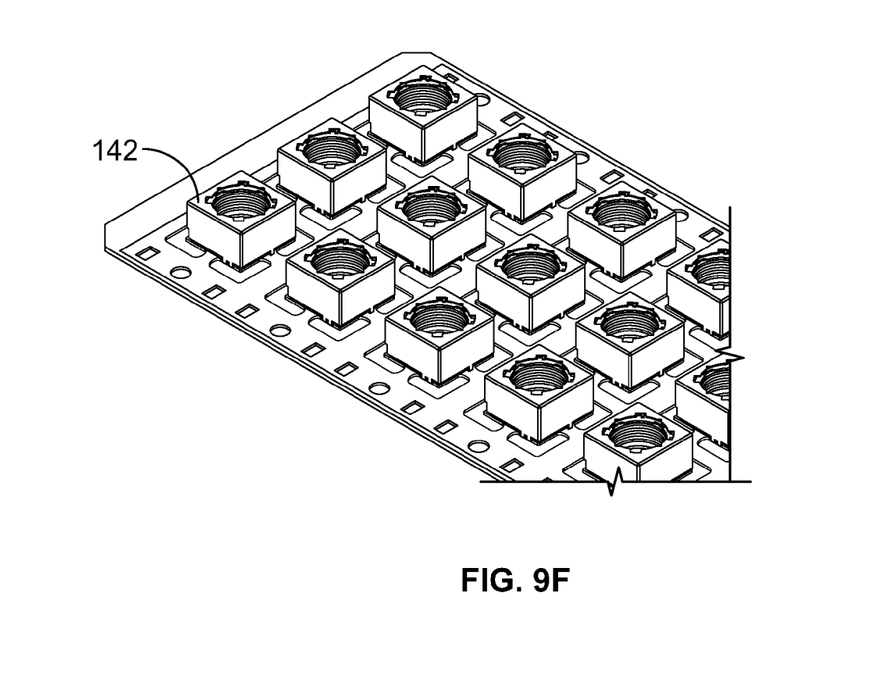

In step 808, shown in FIGS. 9E-9F, the lens housing 142 is coupled to the upper side 121a of the substrate 120. The lens housing 142 may be attached to the substrate 120 by depositing an adhesive, such as an epoxy adhesive, onto a portion of the substrate 120 not otherwise used for electrical connections. The lens module connections 126 may then be coupled to the corresponding contacts 143 in the lens housing 142 using, for example, conventional soldering methods. In FIG. 9F, the lens barrel 146 is omitted for clarity. In practice, the lens housing 142 with lens barrel 146 may or may not be attached to the substrate 120 prior to the singulation described below. In step 810, each camera module 100 may then be singulated from the strip array 920 for integration with an electronic device, such as computing device 200. In some examples, the camera module 100 may be singulated before the lens housing 142 is coupled thereto.

In step 812, the camera module 100 is coupled to the main board of the electronic device to form a completed camera module. This may be accomplished using any of a variety of known methods. In the embodiment illustrated in FIGS. 9C-9D, the bottom side 121b of the substrate includes an LGA 944 with main board contacts 132 which can be bonded directly to corresponding contacts on the main board or to an intermediate interposer structure, such as a cable or circuit board, which is in turn coupled to the main board. For example, an interposer may be utilized to prevent wire bonds 107 from being in contact with the main board. The LGA 944 may be bonded to the main board contacts 132 using any suitable technology including, for example, anisotropic conductive film, hot-bar soldering, a ball grid array, etc.

It will be understood that in other embodiments, the type, arrangement, and manufacturing steps for the various components of the camera module may vary. For example, as illustrated in FIG. 9B, the electronic components 135 are mounted on the substrate 120 along all four edges of the image sensor opening 122. In other embodiments, the electronic components 135 may be mounted on fewer than four edges or may be positioned elsewhere in the camera module 100. In addition, the electronic components 135 need not be positioned within the cavity of the lens housing 142.

The above-described embodiments may achieve a number of advantages over conventional camera module designs utilizing conventional flip-chip sensor dies. For example, because the camera module utilizes wire bonds to connect the sensor die to the substrate, the manufacturing process may be less sensitive to the alignment of the sensor die relative to the substrate. For example, slight skews may be overcome by proper directing of the wire bonds. This may decrease yield loss. For example, a standard flip-chip installation may have a yield of between 89% and 93% (and a corresponding yield loss of between 7% and 11%). On the other hand, a camera module as described herein may have a yield as high as 99% or higher. Also, the described camera module may enjoy increased coplanarity between the sensor die and the substrate. This may be because of a lack of contacts between the sensor die and substrate. Increased coplanarity may allow the optimization of the optical alignment between the sensor die and the lens housing.

Although the flowcharts and methods described herein may describe a specific order of execution, it is understood that the order of execution may differ from that which is described. For example, the order of execution of two or more blocks or steps may be scrambled relative to the order described. Also, two or more blocks or steps may be executed concurrently or with partial concurrence. Further, in some embodiments, one or more of the blocks or steps may be skipped or omitted. It is understood that all such variations are within the scope of the present disclosure.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. The various features and processes described above may be used independently of one another, or may be combined in various ways. All possible combinations and sub-combinations are intended to fall within the scope of this disclosure.

In addition, conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Although this disclosure has been described in terms of certain example embodiments and applications, other embodiments and applications that are apparent to those of ordinary skill in the art, including embodiments and applications that do not provide all of the benefits described herein, are also within the scope of this disclosure. The scope of the inventions is defined only by the claims, which are intended to be construed without reference to any definitions that may be explicitly or implicitly included in any incorporated-by-reference materials.

What is claimed is:

1. A camera module, comprising:
   a lens module comprising a lens housing and at least one lens;
   an image sensor module comprising:
     a rigid substrate having an image sensor opening, the rigid substrate comprising:
       an upper side coupled to the lens housing; and
       a lower side comprising a plurality of substrate-sensor contacts; and an image sensor die mechanically coupled to the lower side of the rigid substrate, the image sensor die comprising:
- a photosensor portion;
- a thinned wafer portion adjacent the photosensor portion, wherein the photosensor portion is positioned to receive optical energy through the image sensor opening and the thinned wafer portion, and wherein at least a portion of the optical energy received by the photosensor portion is transmitted through the image sensor opening and the thinned wafer portion to the photosensor portion; and
- a carrier wafer portion comprising a first side adjacent the photosensor portion and a second side opposite the first side, the carrier wafer portion comprising a plurality of die contacts, the plurality of die contacts being positioned on the second side of the carrier wafer portion, and wherein each of the plurality of die contacts is electrically coupled to at least one of the plurality of substrate-sensor contacts with a wire bond.

2. The camera module of claim 1, wherein the image sensor die further comprises a metal layer positioned between the photosensor portion and the carrier wafer portion, wherein the metal layer provides at least one electrical connection at the photosensor portion.

3. The camera module of claim 1, wherein the image sensor die is coupled to the lower side of the rigid substrate utilizing one of a non-conductive epoxy polymer, a non-conductive paste, a solder paste, or an anisotropic conductive film.

4. The camera module of claim 1, wherein the carrier wafer portion comprises at least one via extending through the carrier wafer portion from the photosensor portion to a die contact selected from the plurality of die contacts.

5. A camera module, comprising:
- a lens module comprising at least one lens;
- an image sensor module comprising:
  - a substrate having an opening, the substrate comprising:
    - an upper side; and
    - a lower side comprising a plurality of substrate-sensor contacts; and
  - a sensor die physically coupled to the lower side of the substrate, the sensor die comprising:
    - a photosensor portion exposed through the opening; and
    - a carrier wafer portion comprising a first side adjacent the photosensor portion and a second side opposite the first side, the carrier wafer portion comprising a plurality of die contacts, the plurality of die contacts being positioned on the second side of the carrier wafer portion, and wherein each of the plurality of die contacts is electrically coupled to at least one of the plurality of substrate-sensor contacts with a wire bond.

6. The camera module of claim 5, wherein the lens module further comprises a lens housing coupled to the at least one lens, wherein the lens housing is also coupled to the upper side of the substrate, and wherein the photosensor portion is exposed to the at least one lens through the opening of the substrate.

7. The camera module of claim 5, wherein the sensor die further comprises a thinned wafer portion positioned between the photosensor portion and the substrate, wherein the photosensor portion is positioned to receive optical energy through the opening and the thinned wafer portion.

8. The camera module of claim 7, wherein the thinned wafer portion comprises a via extending from the photosensor portion to the substrate.

9. The camera module of claim 5, wherein the carrier wafer portion comprises a via extending from the photosensor portion to a die contact selected from the plurality of die contacts.

10. The camera module of claim 5, wherein the photosensor portion comprises one of a complementary metal-oxide-semiconductor (CMOS) photodiode or a charge coupled device.

11. The camera module of claim 5, wherein the sensor die is coupled to the lower side of the substrate utilizing one of a non-conductive epoxy polymer, a non-conductive paste, a solder paste, or an anisotropic conductive film.

12. A method of forming a sensor, the method comprising:
- mechanically bonding a sensor die to a lower side of a substrate, wherein the substrate has a sensor opening and comprises an upper side and the lower side, wherein the lower side of the substrate comprises a plurality of substrate-sensor contacts, wherein the sensor die comprises a photosensor portion, a thinned wafer portion adjacent the photosensor portion and a carrier wafer portion, wherein the photosensor portion is positioned between the thinned wafer portion and the carrier wafer portion, wherein, after the bonding, the photosensor portion is exposed through the sensor opening and the thinned wafer portion, and wherein the carrier wafer portion comprises a plurality of die contacts positioned on a side of the carrier wafer portion directed away from the photosensor portion; and
- forming a wire bond between a substrate-sensor contact selected from the plurality of substrate-sensor contacts and a die contact selected from the plurality of die contacts.

13. The method of claim 12, further comprising forming the plurality of die contacts on the side of the carrier wafer portion.

14. The method of claim 13, further comprising:
- forming a first via through the carrier wafer portion;
- forming the die contact selected from the plurality of die contacts; and
- connecting the die contact to the first via.

15. The method of claim 12, wherein mechanically bonding comprises mechanically bonding the thinned wafer portion to the lower side of the substrate.

16. The method of claim 12, wherein mechanically bonding comprises at least one of: applying a non-conductive epoxy, applying a non-conductive paste, applying a solder paste, or applying an anisotropic conductive film.

17. The method of claim 12, further comprising coupling a lens module to the upper side of the substrate.

18. An image sensor comprising:
- a thinned wafer;
- a photosensor portion formed on a first side of the thinned wafer, wherein light incident on a second side of the thinned wafer opposite the first side is transmitted through the thinned wafer to the photosensor portion; and
- a carrier wafer portion mechanically coupled to the first side of the thinned wafer, the carrier wafer portion comprising a first side adjacent the first side of the thinned wafer and a second side opposite the first side, wherein the carrier wafer portion comprises a plurality of vias electrically coupled to the photosensor portion and a plurality of die contacts on the second side of the carrier wafer portion, wherein each of the plurality of die contacts is electrically coupled to at least one of the plurality of vias.

19. The image sensor of claim 18, wherein the plurality of die contacts are electrically coupled to a substrate with at least one wire bond.

20. The image sensor of claim 19, wherein the thinned wafer is mechanically coupled to a lower side of the substrate.

\* \* \* \* \*